United States Patent
Chen et al.

(10) Patent No.: US 9,012,324 B2
(45) Date of Patent: Apr. 21, 2015

(54) THROUGH SILICON VIA PROCESS

(75) Inventors: Jia-Jia Chen, Taichung (TW); Chi-Mao Hsu, Tainan (TW); Tsun-Min Cheng, Changhua County (TW); Ching-Wei Hsu, Changhua County (TW); Szu-Hao Lai, Kaohsiung (TW); Huei-Ru Tsai, Kaohsiung (TW); Tsai-Yu Wen, Tainan (TW); Ching-Li Yang, Ping-Tung Hsien (TW); Chien-Li Kuo, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/593,517

(22) Filed: Aug. 24, 2012

(65) Prior Publication Data

US 2014/0057434 A1 Feb. 27, 2014

(51) Int. Cl.
*H01L 21/768* (2006.01)
*H01L 23/48* (2006.01)

(52) U.S. Cl.
CPC .................. *H01L 21/76898* (2013.01)

(58) Field of Classification Search
CPC ............. H01L 23/481; H01L 2225/06541; H01L 2225/06548; H01L 21/76898; H01L 23/49827
USPC ......... 438/597, 598, 759, 778, 791, 787, 107, 438/667; 257/E21.575, E21.597
See application file for complete search history.

(56) References Cited

U.S. PATENT DOCUMENTS

| | | | | |
|---|---|---|---|---|
| 5,659,127 A * | 8/1997 | Shie et al. | ...... | 73/31.05 |
| 6,448,174 B1 * | 9/2002 | Ramm | ...... | 438/637 |
| 6,458,696 B1 * | 10/2002 | Gross | ...... | 438/668 |
| 7,560,802 B2 * | 7/2009 | Kalvesten et al. | ...... | 257/621 |
| 8,138,533 B2 * | 3/2012 | Koike et al. | ...... | 257/292 |
| 8,455,973 B2 * | 6/2013 | Fujii et al. | ...... | 257/502 |
| 8,466,062 B2 * | 6/2013 | Lu et al. | ...... | 438/667 |
| 8,835,308 B2 * | 9/2014 | Cao | ...... | 438/643 |
| 2002/0028532 A1 * | 3/2002 | Tsunashima | ...... | 438/106 |
| 2003/0200654 A1 * | 10/2003 | Omote et al. | ...... | 29/852 |
| 2005/0009329 A1 * | 1/2005 | Tanida et al. | ...... | 438/667 |
| 2005/0014311 A1 * | 1/2005 | Hayasaka et al. | ...... | 438/109 |
| 2005/0167805 A1 * | 8/2005 | Usami | ...... | 257/678 |
| 2005/0199941 A1 * | 9/2005 | Anezaki | ...... | 257/316 |
| 2005/0258447 A1 * | 11/2005 | Oi et al. | ...... | 257/100 |
| 2005/0275108 A1 * | 12/2005 | Saiki et al. | ...... | 257/758 |
| 2007/0042563 A1 * | 2/2007 | Wang et al. | ...... | 438/424 |
| 2007/0290300 A1 * | 12/2007 | Kawakami | ...... | 257/621 |
| 2008/0006931 A1 * | 1/2008 | Oliver et al. | ...... | 257/712 |
| 2008/0171430 A1 * | 7/2008 | Kamins | ...... | 438/618 |
| 2008/0290525 A1 * | 11/2008 | Anderson et al. | ...... | 257/774 |
| 2008/0299739 A1 * | 12/2008 | Yoshizawa et al. | ...... | 438/424 |
| 2009/0302478 A1 * | 12/2009 | Pagaila et al. | ...... | 257/774 |
| 2010/0048019 A1 * | 2/2010 | Kawano et al. | ...... | 438/675 |
| 2010/0078776 A1 * | 4/2010 | Barth et al. | ...... | 257/659 |
| 2010/0171197 A1 * | 7/2010 | Chang et al. | ...... | 257/621 |
| 2010/0178747 A1 * | 7/2010 | Ellul et al. | ...... | 438/386 |
| 2010/0314762 A1 * | 12/2010 | Schrank et al. | ...... | 257/741 |

(Continued)

FOREIGN PATENT DOCUMENTS

WO WO 2004084300 A1 * 9/2004 ............ H01L 21/768
WO WO 2012144951 A1 * 10/2012

*Primary Examiner* — Michele Fan
(74) *Attorney, Agent, or Firm* — Winston Hsu; Scott Margo

(57) ABSTRACT

A through silicon via process includes the following steps. A substrate having a front side and a back side is provided. A passivation layer is formed on the back side of the substrate. An oxide layer is formed on the passivation layer.

15 Claims, 7 Drawing Sheets

(56) References Cited

U.S. PATENT DOCUMENTS

| | | | |
|---|---|---|---|
| 2011/0026232 A1* | 2/2011 | Lin et al. | 361/760 |
| 2011/0084385 A1* | 4/2011 | Itaya et al. | 257/737 |
| 2011/0095395 A1* | 4/2011 | Ellul et al. | 257/531 |
| 2011/0133333 A1* | 6/2011 | Kwon et al. | 257/737 |
| 2011/0193242 A1* | 8/2011 | Uchiyama | 257/774 |
| 2011/0195572 A1* | 8/2011 | Uchiyama | 438/667 |
| 2011/0198721 A1* | 8/2011 | Yang et al. | 257/506 |
| 2011/0272821 A1* | 11/2011 | Taguchi et al. | 257/774 |
| 2011/0272823 A1* | 11/2011 | Sanders et al. | 257/774 |
| 2011/0318922 A1* | 12/2011 | Jung et al. | 438/667 |
| 2012/0074509 A1* | 3/2012 | Berg et al. | 257/416 |
| 2012/0074582 A1* | 3/2012 | Yu et al. | 257/774 |
| 2012/0074584 A1* | 3/2012 | Lee et al. | 257/774 |
| 2012/0083116 A1* | 4/2012 | Yang et al. | 438/653 |
| 2012/0112361 A1* | 5/2012 | Han et al. | 257/774 |
| 2012/0119311 A1* | 5/2012 | Akhlaghi Esfahany et al. | 257/415 |
| 2012/0153492 A1* | 6/2012 | Bachman et al. | 257/774 |
| 2012/0214302 A1* | 8/2012 | Jeong et al. | 438/613 |
| 2012/0256290 A1* | 10/2012 | Renna et al. | 257/506 |
| 2012/0256300 A1* | 10/2012 | Nakamura | 257/621 |
| 2012/0258594 A1* | 10/2012 | Barth et al. | 438/667 |
| 2013/0015440 A1* | 1/2013 | Dang et al. | 257/48 |
| 2013/0020719 A1* | 1/2013 | Jung et al. | 257/774 |
| 2013/0105968 A1* | 5/2013 | Lu et al. | 257/737 |
| 2014/0008810 A1* | 1/2014 | Leong et al. | 257/774 |
| 2014/0042498 A1* | 2/2014 | Erlesand | 257/254 |

\* cited by examiner

THROUGH SILICON VIA PROCESS

BACKGROUND OF THE INVENTION

1. Field of the Invention

The present invention relates generally to a through silicon via process, and more specifically to a through silicon via process that forms a passivation layer before an oxide layer is formed on a back side of a substrate.

2. Description of the Prior Art

The through-silicon via technique is quite a novel semiconductor technique. The through-silicon via technique advantages resides mainly in solving the problem of the electrical interconnection of chips, and the TSV belong to a new 3D packing technique field. The hot through-silicon via technique creates products that fit better the market trends of "light, thin, short and small devices" through through-silicon via 3D stacking, in order to provide micro electronic mechanic system (MEMS), photoelectronics and electronic elements with packing techniques of wafer-level package.

The through-silicon via technique drills holes in the wafer through etching or using laser then fills the holes with conductive materials such as copper, polysilicon or tungsten to form vias, i.e. conductive channels connecting inner regions and outer regions. Finally, the wafer or the die is thinned to be stacked or bonded together to be a 3D stack IC. In this way, the wire bonding procedure maybe omitted. Using etching or laser techniques to form conductive vias not only avoids the wire bonding step but also reduces the occupied area on the circuit board and the volume to be packed.

The inner connection distance of the package of the 3D stack IC with the through-silicon via technique, i.e. the thickness of the thinned wafer or the die, is much shorter compared to the conventional stack package of wire bonding type, so the 3D stack IC performs better in many ways, for it has a smaller electrical resistance, a faster transmission, a lower noise and better performances. For the CPUs, flash memories and memory cards especially, the advantages of the shorter inner connection distances of the through-silicon via technique are much more outstanding. In addition, the package size of the 3D stack IC is equivalent to the size of the dice, so the through-silicon via technique is more valuable in portable electronic devices.

In a through silicon via process, a wafer must be fixed in an apparatus as processes, such as aforesaid filling the conductive material in vias processes, are performed on the wafer, wherein the wafer may be fixed by vacuum or electrical voltage etc. However, due to the thickness of an oxide layer on a back side of the wafer approaching 1 microns (μm), the wafer is not easy to be fixed on apparatuses, such as an apparatus of E-chuck. Even though the vacuum or the electrical voltage is increased to fix the wafer on the apparatus, incomplete dechucking, shifting, down transferring or popping of the wafer will still occur.

SUMMARY OF THE INVENTION

The present invention provides a through silicon via process, which forms a passivation layer before an oxide layer is formed on aback side of a substrate to reduce the thickness of the oxide layer, thereby preventing incomplete dechucking, shifting, down transferring or popping of a wafer from occurring when the wafer is fixed on an apparatus during later processes.

The present invention provides a through silicon via process including the following steps. A substrate having a front side and a back side is provided. A passivation layer is formed on the back side of the substrate. An oxide layer is formed on the passivation layer.

According to the above, the present invention provides a through silicon via process, which forms a passivation layer on a back side of a substrate, and then forms an oxide layer on the passivation layer. Therefore, the oxide layer is restrained and the thickness of the oxide layer is reduced, thereby preventing incomplete dechucking, shifting, down transferring or popping of a wafer from occurring when the wafer is fixed on an apparatus during later processes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
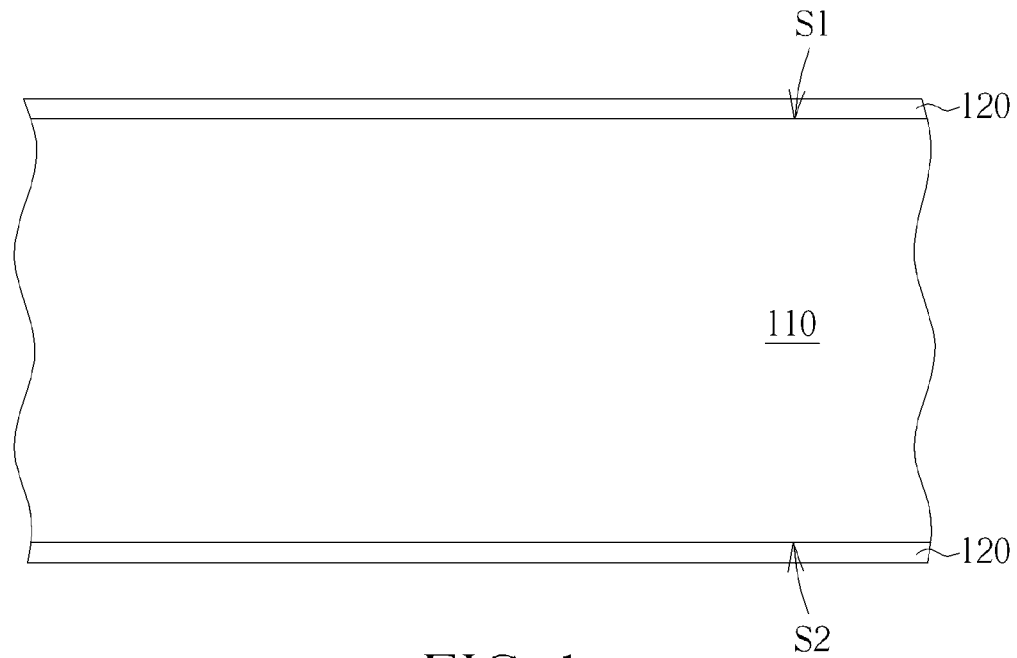
FIGS. 1-8 schematically depict cross-sectional views of a through silicon via process according to an embodiment of the present invention.

FIGS. 1-8 schematically depict cross-sectional views of a through silicon via process according to an embodiment of the present invention. A through silicon interposer (TSI) is presented as an example in the following, but the present invention is not restricted thereto. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate.

Figure 2:
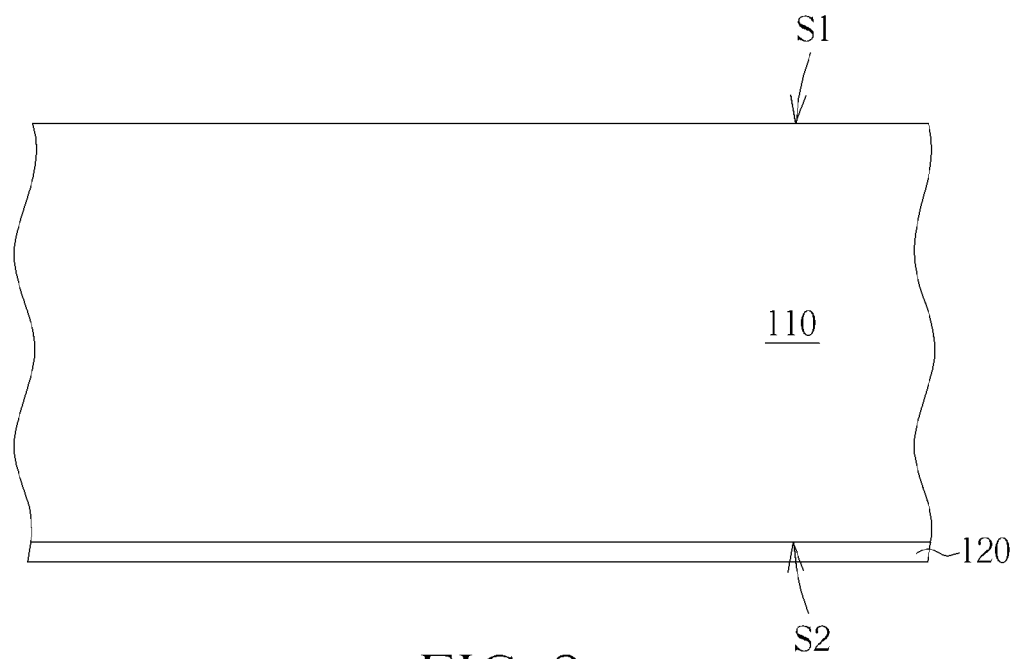

Please refer to FIGS. 1-2. A passivation layer 120 is formed on a back side S2 of the substrate 110. As shown in FIG. 1, the substrate 110 has a front side S1 and a back side S2. The passivation layer 120 is formed on the front side S1 and the back side S2 of the substrate 110 simultaneously. As shown in FIG. 2, the passivation layer 120 on the front side S1 is removed, and the front side S1 of the substrate 110 is therefore exposed. In this embodiment, the passivation layer 120 is a nitride layer, but it is not limited thereto. In another embodiment, the passivation layer 120 may be of other materials, such as amorphous carbon, which can restrain the oxide layer and is preferably easy to be removed. The passivation layer 120 may be formed by a thermal process or a chemical vapor deposition (CVD) process etc. In this embodiment, the passivation layer 120 is a nitride layer, which is formed on the front side S1 and the back side S2 of the substrate 110 simultaneously by a thermal process. In another embodiment, the passivation layer 120 may just be formed on the back side S2 of the substrate 110 by performing a chemical vapor deposition (CVD) process. In this way, there is no passivation layer 120 located on the front side S1 needing to be removed. In another embodiment, the passivation layer 120 located on the front side S1 may not be removed, depending upon the processing or structural needs.

Figure 3:
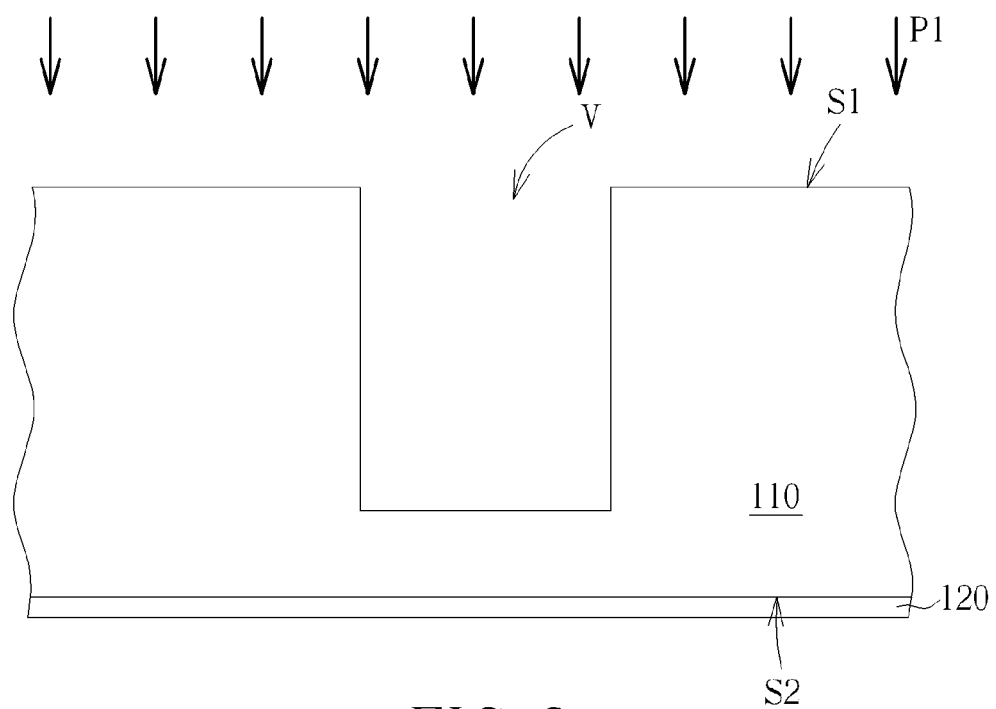

Then, at least a via V is formed in the substrate 110 from the front side S1 of the substrate. As shown in FIG. 3, a via V is formed in the substrate 110 from the front side S1 of the substrate. The via V may be formed through an etching process P1, but it is not limited thereto. The etching process P1 may be a dry etching process, or a dry etching paired with a wet etching process, which forms a predetermined depth of a previous via through the dry etching process and then optimizes the profile of the previous via through the wet etching process, but it is not limited thereto. The via V has a high depth/diameter ratio for forming a through silicon via structure. In general, the depth/diameter ratio of the via V is larger than 10, but it is not limited thereto. In details, a method of forming the via V in the substrate 110 may include the following steps. A hard mask (not shown) is formed on the substrate 110. The hard mask (not shown) may include a pad oxide layer (not shown) and a pad nitride layer (not shown) etc, and even include a passivation layer 120 that was not removed in the previous steps, but it is not limited thereto. Then, the hard mask (not shown) is patterned to form a patterned hard mask (not shown). Thereafter, the pattern of the patterned hard mask (not shown) is transferred to the substrate 110, and the via V is formed in the substrate 110.

Figure 9:
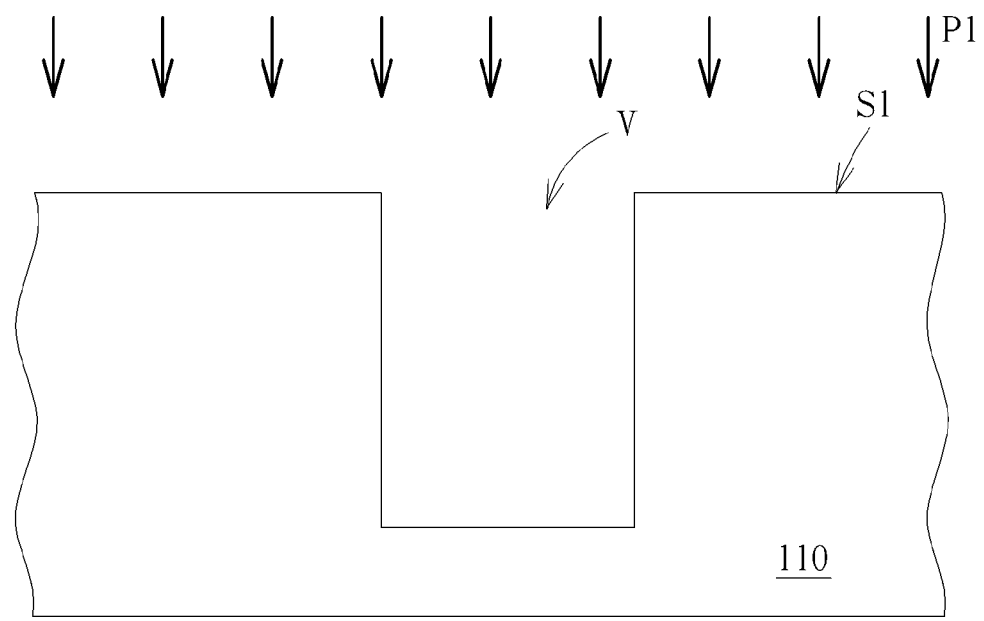
FIGS. 9-10 schematically depict cross-sectional views of a through silicon via process according to another embodiment of the present invention.
Figure 10:
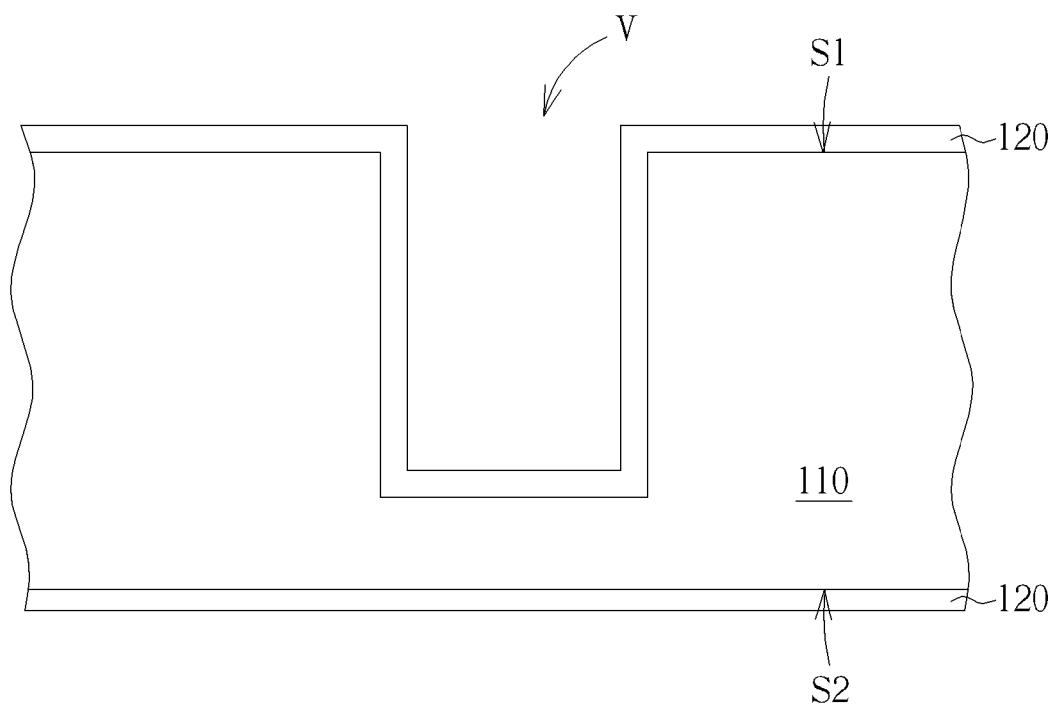

In another way, as shown in FIGS. 9-10, the via V is formed in the substrate 110 and then the passivation layer 120 is formed on the back side S2 of the substrate 110, wherein FIGS. 9-10 schematically depict cross-sectional views of a through silicon via process according to another embodiment of the present invention.

More precisely, as shown in FIG. 9, a via is formed in the substrate 110 from the front side S1 of the substrate 110 through processes such as an etching process P1, wherein the via V may be formed through aforesaid etching processes, and the details are not described again. As shown in FIG. 10, the passivation layer 120 is formed on the front side S1 and the back side S2 of the substrate 110 simultaneously, wherein the passivation layer 120 may be formed through a thermal process or etc. Then, as shown in FIG. 3, the passivation layer 120 located on the front side S1 is removed. In addition, the passivation layer 120 may be just formed on the back side S2 of the substrate 110 through a chemical vapor deposition (CVD) process, so that there is no passivation layer 120 located on the front side S1 of the substrate 110 needing to be removed. In another embodiment, the passivation layer 120 located on the front side S1 of the substrate 110 may not be removed, depending upon the practical needs.

Figure 4:
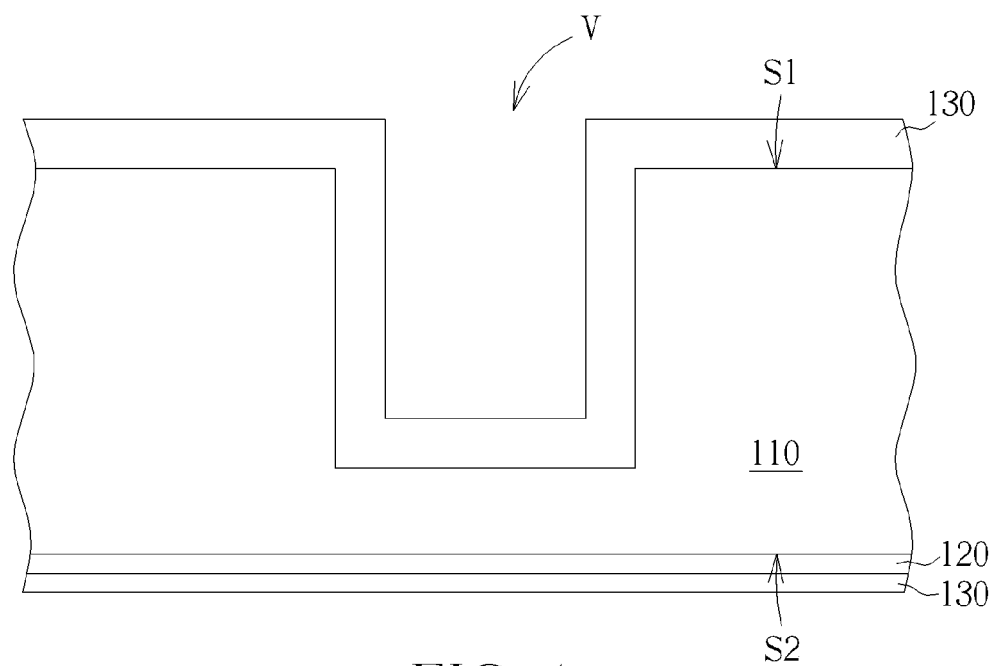

After the via V is formed in the substrate 110 from the front side S1 of the substrate 110 and the passivation layer 120 is formed on the back side S2 of the substrate 110 (by methods shown in FIGS. 1-3 or FIGS. 9-10), an oxide layer 130 with a thickness approaching 1 microns ($\mu m$) is formed on the passivation layer 120 as shown in FIG. 4. In general, the oxide layer 130 may be formed by a thermal oxide process using furnace tubes, so that the oxide layer 130 will be formed not only on the back side S2 but also on the front side S1 of the substrate 110 simultaneously. It is emphasized that, due to the passivation layer 20 being formed on the back side S2 of the substrate 110 and the passivation layer 120 being a nitride layer in this embodiment, not only the oxide layer 130 can be restrained, but also part of the passivation layer 120 can be replaced by oxide as the oxide layer 130 is formed, so that the thickness of the passivation layer 120 is reduced, and the passivation layer 120 and the oxide layer 130 can therefore both be thinned down. So, stresses in the substrate 110 induced by the passivation layer 120 can be reduced by thinning down the thickness of the passivation layer 120.

Figure 5:
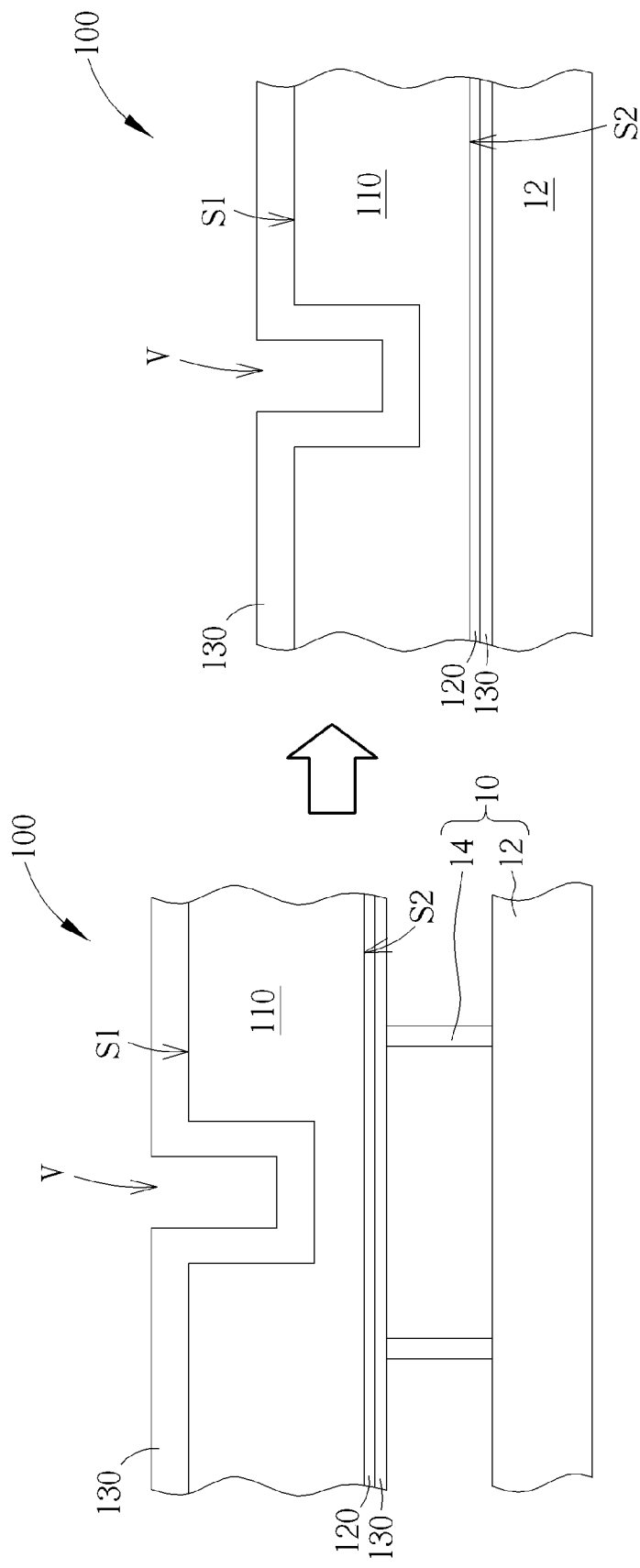

As shown in FIG. 5, a wafer 100 is fixed on an apparatus 10 for performing later processes. As shown at the left diagram of FIG. 5, the apparatus 10 has a base 12 and a plurality of telescopic thimbles 14 protruding from the base 12. The wafer 100 is disposed on the telescopic thimbles 14. Then, the telescopic thimbles 14 are retracted into the base 12, as shown at the right diagram of FIG. 5, enabling the wafer 110 loaded on the base 12 to undergo later processes such as sputtering. It is emphasized, since the passivation layer 120 is formed on the back side S2 of the substrate 110 before the oxide layer 130 is formed, that the thickness of the oxide layer 130 located on the back side S2 of the substrate 110 can be reduced. In one case, when a 300 angstroms thick nitride layer is formed at the same time as the passivation layer 120 and the 1 micron thick oxide layer 130 are formed, only a 266 angstroms thick oxide layer 130 and a 147 angstroms thick nitride layer are actually formed on the back side S2 of the substrate 110. In other words, 153 angstroms of the nitride layer are replaced by a part of the oxide layer 130, and only a 113 angstroms thick oxide layer 130 is formed. Therefore, by applying the present invention, which forms the passivation layer 120 on the back side S2 of the substrate 110 and then forms the oxide layer 130 on the passivation layer 120, the oxide layer 130 can be restrained, thereby preventing incomplete dechucking, shifting, down transferring, popping of the wafer 100 from occurring when the wafer is fixed on the apparatus 10 during processes, that were caused by the too thick oxide layer 130. Moreover, in accordance with experimental data, as the 300 angstroms thick nitride layer is formed and serves as the passivation layer 120, the oxide layer 130 can be restrained effectively. In other words, as the thickness of the nitride layer is less than 300 angstroms, the oxide layer 130 can not be restrained effectively; as the thickness of the nitride layer is larger than 300 angstroms, the thickness of the oxide layer being formed is almost the same as the thickness of the oxide layer being formed as the thickness of the nitride layer is 300 angstroms, but the processing time and the processing costs are increased, and stresses in the substrate 110 induced by the nitride layer are increased as well.

In this embodiment, the oxide layer 130 is formed by performing a boro-phosphosilicate glass (BP-FLOW) process, but it is not limited thereto. Moreover, a pad layer (not shown) or an insulating layer (not shown) maybe selectively formed in the via V, especially formed on the sidewalls of the via V, before the oxide layer 130 is formed. The pad layer (not shown) or the insulating layer (not shown) may be an oxide layer or a nitride layer etc, so that the oxide layer 130 will be thickened, or a double layer structure such as a nitride/oxide layer, a triple layer structure such as an oxide/nitride/oxide layer, or a multilayer structure may be formed.

To clarify the present invention, the apparatus 10 is omitted in the following figures, and semiconductor processes performed on the apparatus 10 are described later.

Figure 6:
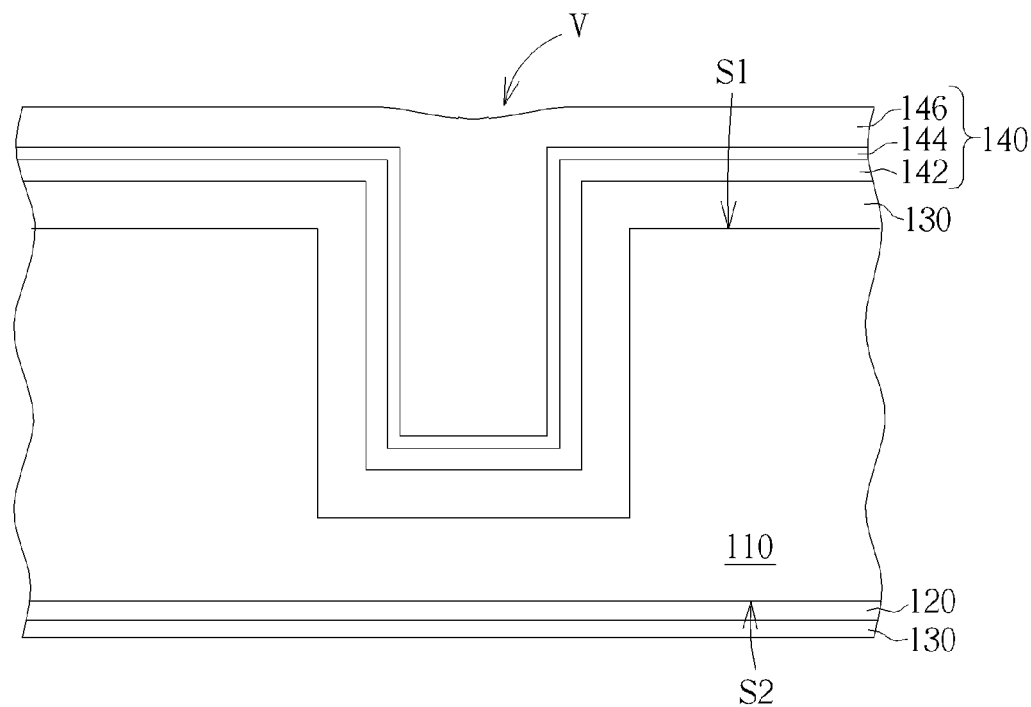

As shown in FIG. 6, a conductive material 140 is filled in the via V. The conductive material 140 may include a barrier layer 142, a seeding layer 144 and a main conductive layer 146. More precisely, the barrier layer 142 is formed on the oxide layer 130, and then the seeding layer 144 is formed on the barrier layer 142. Thereafter, the main conductive layer 146 is filled into the via V. The barrier layer 142 may be a single layer or multilayer structure composed of a titanium nitride layer or a tantalum nitride layer etc. The seeding layer 144 and the main conductive layer 144 maybe composed of copper or etc. The seeding layer 144 may be formed through a physical vapor deposition (PVD) process for the main conductive layer 146 attaching thereon. Therefore, the main conductive layer 146 can be formed on the seeding layer 144 through an electro-chemical plating (ECP) process.

Figure 7:
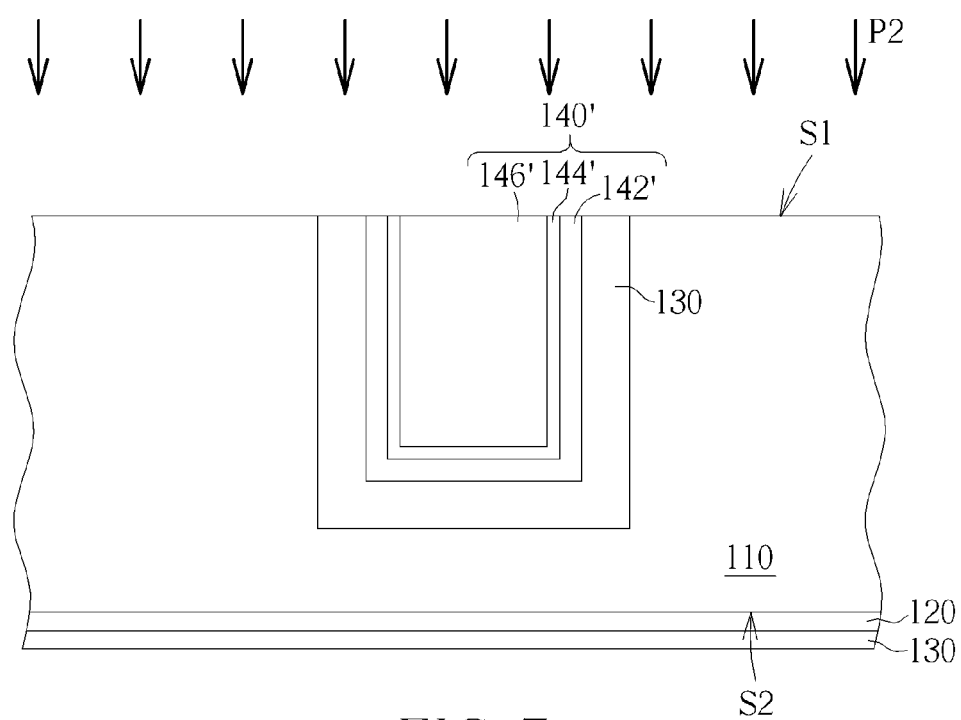
Figure 8:
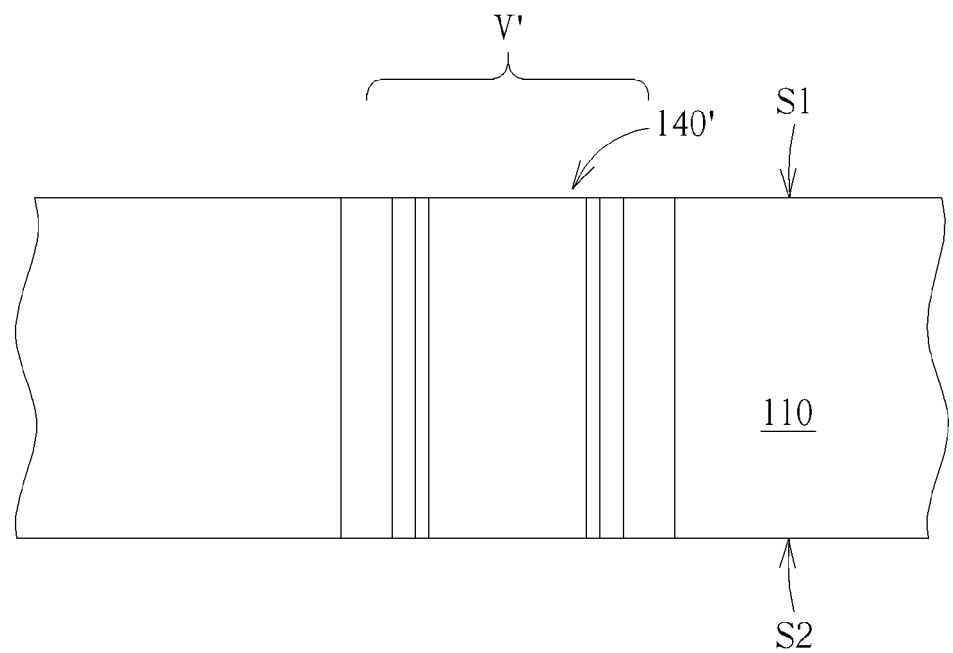

A chemical mechanical polishing process P2 is performed to planarize the conductive material 140 until the front side S1 of the substrate, the hard mask (not shown) on the front side S1 or the passivation layer 120 not being removed in previous processes is exposed. Therefore, a planarized conductive material 140' is formed as shown in FIG. 7, wherein the planarized conductive material 140' may include a planarized barrier layer 142', a planarized seeding layer 144' and a planarized main conductive layer 146'. The oxide layer 130 and the passivation layer 120 on the back side S2 of the substrate 110 maybe selectively removed, and then the substrate 110 may be thinned down from the back side S2 of the substrate 110 until the planarized conductive material 140' being exposed and a through silicon via V' is formed as shown in FIG. 8.

According to the above, the passivation layer 120 is formed at least on the back side S2 of the substrate 110 and then the oxide layer 130 is formed on the passivation layer 120. By doing this, the oxide layer 130 is restrained, and the thickness of the oxide layer 130 is reduced. This way, incomplete dechucking, shifting, down transferring and popping of the wafer 100 as the wafer is fixed on the apparatus 10 during processes are prevented.

The through silicon interposer (TSI) is presented as an example of a through silicon via of the present invention, but there are also other through silicon via processes with wafer degrees, such as via first processes or via last processes that can use the present invention. For example, a via first process may be divided into two kinds that form the through silicon via structures before or after the MOS transistors are formed. There are two embodiments using the through silicon via (TSV) process of the present invention presented in the following, but the applications of the present invention are not restricted to these embodiments.

Figure 11:
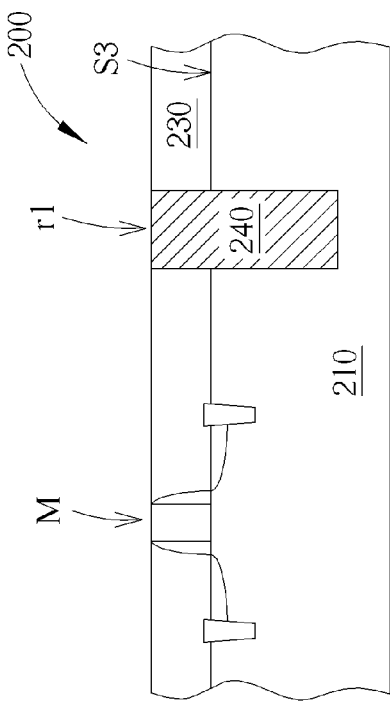
FIG. 11 schematically depicts a cross-sectional view of a through silicon via process according to an embodiment of the present invention.
Figure 11:
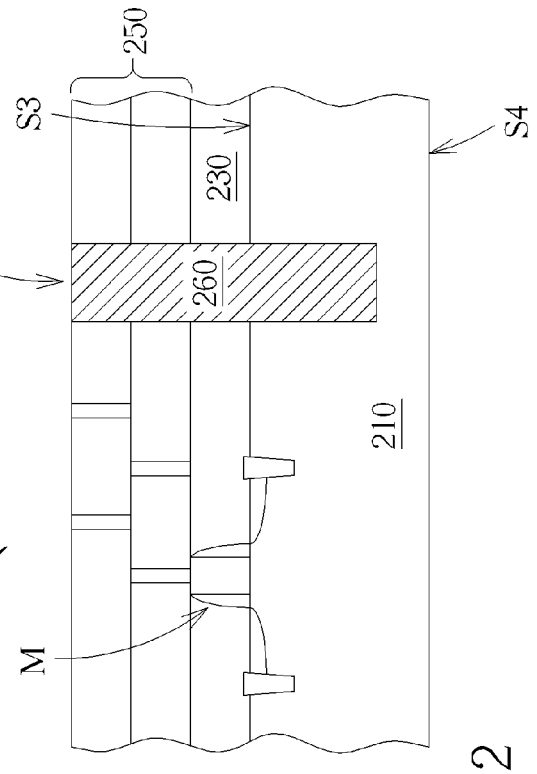

As shown in FIG. 11, a flow of a via first process after MOS transistors are formed and before metal interconnects are formed includes the following steps. A MOS transistor M is formed on a front side S3 of a substrate 210 (as shown in the left diagram), and an interdielectric layer 230 is formed on the front side S3; then, a recess r1 is formed in the interdielectric layer 230 and the substrate 210 from the front side S3 of the substrate 110; an insulating layer (not shown) is formed on the sidewalls and the bottom of the recess r1, and a conductive metal 240 is filled (as shown in the right diagram). Thereafter, metal interconnects are formed and the substrate 210 is thinned down from a back side S4 of the substrate 110 until the conductive metal 240 is exposed.

According to the above, the through silicon via process of the present invention is performed before the insulating layer is filled (as shown in the right diagram). That is, a passivation layer (not shown) is formed on the back side S4 of the substrate 210, and then the insulating layer is formed on the passivation layer, so that the wafer 200 can be statically fixed on the apparatus (not shown) to perform later processes. In this embodiment, since active components are already formed on the front side S3 of the substrate 210, the passivation layer is preferred to be formed on the back side S4 of the substrate 210 by a chemical vapor deposition process to prevent the performance and the reliability of the active components from being affected.

Figure 12:
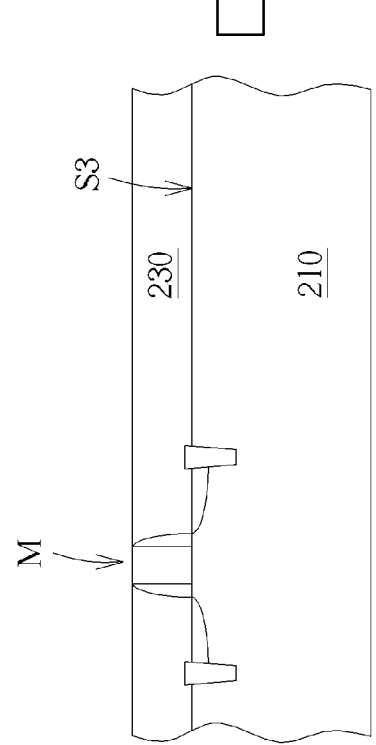
FIG. 12 schematically depicts a cross-sectional view of a through silicon via process according to an embodiment of the present invention.
Figure 12:
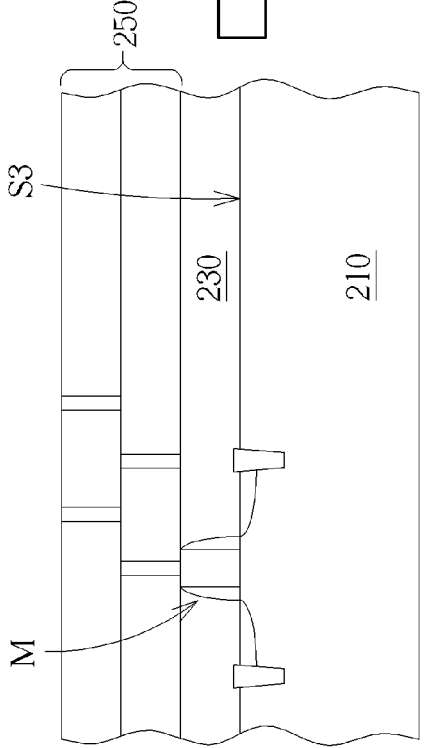

In addition, as shown in FIG. 12, a flow of a via last process after metal interconnects are formed includes the following steps. A MOS transistor M is formed on a front side S3 of a substrate 210, and an interdielectric layer 230 and a multilayer interconnect structure 250 are formed on the front side S3 (as shown in the left diagram); then, a recess r2 is formed in the multilayer interconnect structure 250, the interdielectric layer 230 and the substrate 210 from the front side S3 of the substrate 210; an insulating layer (not shown) is formed on the sidewalls and the bottom of the recess r2, and a conductive metal 260 is filled (as shown in the right diagram).

According to the above, the through silicon via process of the present invention is performed before the insulating layer is filled (as shown in the right diagram). That is, a passivation layer (not shown) is formed on the back side S4 of the substrate 110, and then the insulating layer is formed on the passivation layer, so that the wafer 200 can be statically fixed on the apparatus (not shown) to perform later processes. In this embodiment, since active components are already formed on the front side S3 of the substrate 210, the passivation layer is preferred to be formed on the back side S4 of the substrate 210 by a chemical vapor deposition process to prevent the performance and the reliability of the active components from being affected.

To summarize, the present invention provides a through silicon via process, which forms a passivation layer on a back side of a substrate, and then forms an oxide layer on the passivation layer. Therefore, the oxide layer is restrained, and the thickness of the oxide layer is reduced, thereby preventing incomplete dechucking, shifting, down transferring or popping of a wafer from occurring as the wafer is fixed on an apparatus to perform later processes.

More precisely, the passivation layer may be formed before/after the etching process is performed. The passivation layer may be formed only on the back side of the substrate through processes such as a chemical vapor deposition (CVD) process. The passivation layer may also be formed on the back side or the front side of the substrate through processes such as a thermal process, and then the passivation layer located on the front side of the substrate may be selectively removed, depending upon the processing or structural needs. Moreover, the through silicon via process of the present invention may be paired with various through silicon via processes such as via first processes or via last processes etc to form different semiconductor structures having through silicon vias.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A through silicon via process, comprising:
providing a substrate, having a front side and a back side;
forming at least a via in the substrate from the front side of the substrate;
forming a passivation layer on the back side of the substrate and in direct contact with the back side of the substrate;
forming an oxide layer on the passivation layer and in the via simultaneously, said oxide layer being formed on the back side of the substrate in direct contact with the passivation layer,
wherein part of the passivation layer is replaced by oxide as the oxide layer is formed, so the part of the passivation layer forms a part of the oxide layer; and
removing the oxide layer on the passivation layer and the passivation layer completely, thereby forming a through silicon via.

2. The through silicon via process according to claim 1, wherein the passivation layer comprises a nitride layer.

3. The through silicon via process according to claim 1, wherein the passivation layer is formed through a thermal process or a chemical vapor deposition (CVD) process.

4. The through silicon via process according to claim 1, wherein the passivation layer is also formed on the front side of the substrate as the passivation layer is formed on the back side of the substrate.

5. The through silicon via process according to claim 1, wherein the steps of forming the passivation layer on the back side of the substrate comprise:
   forming the passivation layer on the front side and the back side of the substrate simultaneously; and
   removing the passivation layer on the front side.

6. The through silicon via process according to claim 1, wherein the oxide layer is formed through a thermal oxide process.

7. The through silicon via process according to claim 1, further comprising:
   performing an etching process to form the via in the substrate from the front side of the substrate.

8. The through silicon via process according to claim 7, wherein the etching process is performed before the passivation layer is formed.

9. The through silicon via process according to claim 7, wherein the etching process is performed after the passivation layer is formed.

10. The through silicon via process according to claim 1, wherein the depth/diameter ratio of the via is larger than 10.

11. The through silicon via process according to claim 1, further comprising:
    filling a conductive material in the via after the oxide layer is formed.

12. The through silicon via process according to claim 11, wherein the conductive material comprises a barrier layer, a seeding layer and a main conductive layer.

13. The through silicon via process according to claim 12, wherein the steps of filling the conductive material in the via comprise:
    filling the barrier layer on the sidewalls of the via;
    filling the seeding layer on the barrier layer; and
    filling the main conductive layer in the via.

14. The through silicon via process according to claim 11, further comprising:
    performing a polishing process to planarize the conductive material after the conductive material is filled in the via.

15. The through silicon via process according to claim 1, further comprising:
    thinning down the substrate from the back side of the substrate after the oxide layer is removed.

* * * * *